INVENTOR
ERVIN M. BRADBURD
BY
ATTORNEY

INVENTOR
ERVIN M. BRADBURD
BY [signature]
ATTORNEY

Aug. 20, 1957 E. M. BRADBURD 2,803,710

TUNED HIGH FREQUENCY AMPLIFIER

Filed April 21, 1953 4 Sheets-Sheet 3

INVENTOR
ERVIN M. BRADBURD
BY
Percy P. Lantzy
ATTORNEY

INVENTOR
ERVIN M. BRADBURD
BY Percy P. Lantzy
ATTORNEY

United States Patent Office 2,803,710

Patented Aug. 20, 1957

2,803,710

TUNED HIGH FREQUENCY AMPLIFIER

Ervin M. Bradburd, Fairlawn, N. J., assignor to International Telephone and Telegraph Corporation, a corporation of Maryland Application April 21, 1953, Serial No. 350,010

28 Claims. (Cl. 179—171)

This invention relates to amplifiers and more particularly to V. H. F. and U. H. F. power amplifiers applicable to television and like transmission apparatus.

Power amplifiers are as important in the V. H. F. and U. H. F. frequency ranges as in the low radio frequency range. However, it is obvious that at frequencies in the U. H. F. range proper impedance matching at both the input and output of the power amplifier is more difficult to obtain than in the low radio frequency range. Furthermore, the tuning of the anode tank circuit to accommodate a broadband of frequencies over a moderate range of frequencies likewise presents a difficulty which must be overcome before efficient power amplification is achieved throughout the desired broadband of frequencies.

The impedance matching problem may be overcome by proper selection of an appropriate combination of transmission line matching sections, the combination of such matching sections depending upon the associated electrical circuitry and physical arrangement of said circuitry involved. However, the anode tank circuit configurations and theories heretofore employed are not readily adaptable to handle a broadband of frequencies as employed in transmission systems such as television.

Broadband tank circuits operating at high frequencies in the past have utilized transmission lines as the reactive tuning elements in order that circuits of physically useful size and low loss be realized. For such circuits, it is well known in the art that the bandwidth thereof compared to that for a circuit employing a theoretically lumped inductance is given by the relationship $$\frac{\Delta f}{\Delta f_0}=\frac{2}{1+\frac{2\theta}{\sin 2\theta}}$$

where $\theta$ is the electrical length of the transmission line, $f_0$ is the resonant frequency thereof and $f$ is the actual frequency employed therein. Thus, if an attempt is made to make the physical circuit larger by using lower values of characteristic impedance ($Z_0$) for the transmission line tuning element, the electrical length of the circuit becomes large but the bandwidth thereof theoretically approaches zero. Therefore, for broadband amplifier work, it is desirable to use transmission line circuits of high $Z_0$ and short electrical length to minimize this band narrowing effect which can be shown to be directly proportional to the increase in stored energy in the long transmission line circuit over that of the equivalent lumped circuit.

Accordingly, for an amplifier covering a moderate frequency range if a $Z_0$ is chosen for the high frequency end of the tuning range which will provide a reasonable electrical length to limit the band narrowing effect, then at the low frequency end of the tuning range the electrical and physical length of the circuit or tuning element is excessive. In such a situation a compromise value of $Z_0$ must be chosen for mid-range which results in excessive shortness of length or band narrowing at the tuning range extremities. From this it is obvious that it is desirable to be able to vary $Z_0$ at will for each frequency in the necessary tuning range to obtain the best compromise between physical size and band narrowing.

Therefore, it is an object of this invention to provide an economically constructed amplifier having operating efficiencies and an effective broadband frequency response over a moderate frequency tuning range.

Another object of this invention is the provision of a broadband type circuit whose characteristic impedance may be varied at will for each frequency in a moderate frequency tuning range.

Still another object of this invention is the provision of a radial arrangement of metallic bars whose electrical characteristics are considered inductive elements of the tank circuit having the property of changing the characteristic impedance of the broadband tank circuit for each frequency over a moderate tuning range.

A feature of this invention is the provision of a novel combination of transmission line matching sections to provide a matched coupling of the signal to be amplified to the cathode of a power amplifier type electron discharge device wherein the radio frequency signal and the filament potential are applied to said cathode at the same point without interaction.

Another feature of this invention is the provision of a tank circuit associated with the anode and the radio frequency grounded control grid of the amplifier wherein the inductive tuning elements are arranged in a predetermined manner to cause a resonance at the desired transmission frequency with the interelectrode capacity of the electron discharge device disposed coaxially with the physical arrangement of said tank circuit.

Still another feature of this invention is the provision of a means to adjust the resonant frequency of the tank circuit from one frequency to another frequency over a moderate range of tuning frequencies by either changing the number of inductive elements and/or altering the physical size of these inductive elements in a predetermined manner to achieve the desired frequency tuning.

A further feature of this invention is the provision of vernier means associated with at least one of the inductive elements wherein the primary resonant frequency may be slightly adjusted to correct for possible discrepancies in the physical resonance of the inductive elements and interelectrode capacity.

The above-mentioned and other features and objects of this invention will become more apparent by reference to the following description taken in conjunction with the accompanying drawings, in which.

Figure 1:
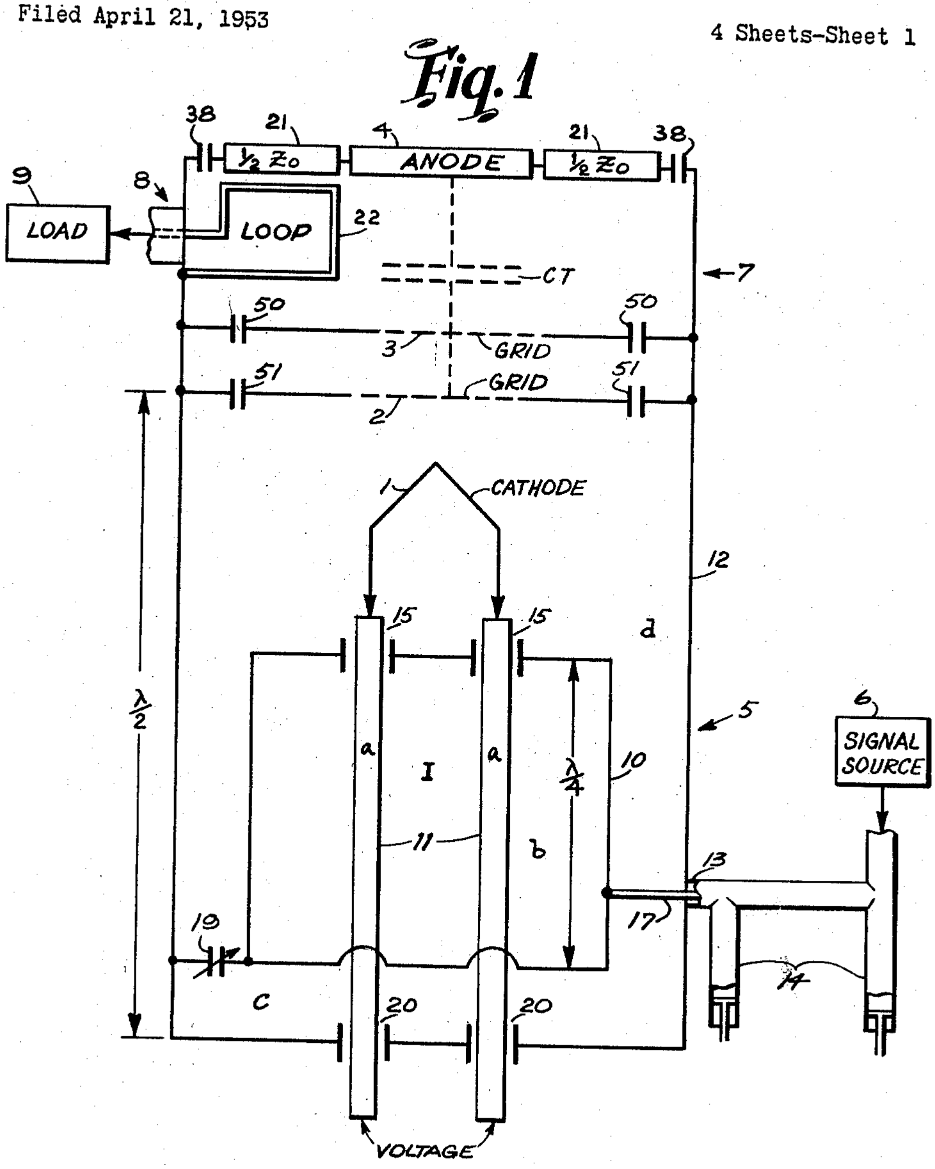
Fig. 1 is a diagrammatic illustration of the equivalent circuit of a power amplifier in accordance with the principles of this invention.

Referring to Fig. 1, an equivalent circuit of an embodiment of the power amplifier of my invention is illustrated diagrammatically as comprising an electron discharge device of the power amplifier type having for purpose of explanation a directly heated cathode 1, a control grid 2, a screen grid 3 and an anode 4, an input matching means 5 to properly couple a radio frequency (R. F.) signal from source 6 to the internal impedance existing between cathode 1 and grid 2 without interaction between the R. F. signal and the D. C. potential applied thereto, a resonant tank circuit 7 associated structurally and electrically with anode 4 and the radio frequency grounded control grid 2, and an output means 8 to couple the power amplified R. F. signal from tank circuit 7 to a useful load 9, such as an antenna.

Figure 2:
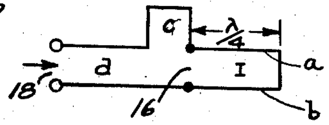
Fig. 2 is an equivalent circuit of the input portion of Fig. 1.

With particular reference to input matching means 5 attention is directed to Fig. 2, as well as Fig. 1, wherein an equivalent transmission line matching circuit is illustrated to more clearly indicate the function of the structural arrangement employed therein from a radio frequency view point. The electron discharge device has an inherent impedance existing between cathode 1 and control grid 2 which must be properly matched to the impedance of the input line usually 50 ohms for a reflectionless transfer of energy thereto. To accomplish this match it is necessary to provide a combination of matching sections as illustrated in Fig. 2 wherein matching section I is formed by a parallel combination of inner matching section 10 and the D. C. input leads 11 which are indicated as *a* and *b* in Figs. 1 and 2, where *a* represents the parallel disposition of leads 11 and *b* represents the transmission line equivalent of section 10. The electrical length of outer shell 12 extending from grid 2 to the bottom thereof is one half a wavelength with a portion thereof forming the transmission line equivalent as indicated at *c* between section 10 and the bottom of shell 12. Transmission line matching section existing between section 10 and shell 12 has a variation of impedance which allows the impedance matching of a coaxial input line to the inherent impedance existing between cathode 1 and grid 2 when direct connection is made on section 10 at the predetermined point. The combination of these matching sections as indicated in Fig. 1 provides a means to match the 50 ohm coaxial transmission line 13 incorporating therewith a double stub tuner 14 to the relatively low inherent interelectrode impedance and at the same time provides a high voltage point input to cathode 1 for the R. F. signal. This R. F. signal is conducted along the surface of section 10 through the by-pass condensers 15 onto cathode 1 without an interaction with the potential applied to cathode 1 for heating the same. The high voltage point input to cathode 1 is indicated in Fig. 2 at 16 while the direct coupling from the center conductor 17 of the coaxial transmission line 13 is indicated at point 18 of Fig. 2.

As will be recognized the employment of the double stub tuner 14 enables adjustment for impedance match to accommodate various differences in the interelectrode impedance that may be encountered when the electron discharge device is changed. Input means 5 is further provided with a variable capacitance 19 between the outer portion of section 10 and the reference potential shell 12 which provides a vernier control of the impedance match for a particular structural arrangement capable of handling an R. F. signal having a particular frequency. It is further indicated that the electrical length of matching section I is one quarter of a wavelength which when in combination with the novel arrangement of matching sections provides a freedom from interaction between the radio frequency signal and the heater potential applied at the same point. The heater voltage leads 11 are further shown to be frequency by-passed by bypass condensers 20 which also cooperate to form the impedance matching arrangement and prevent the undesired interaction.

The signal source 6 feeding its energy into double stub 14 for transfer of energy to the power amplifier as hereinabove outlined may consist of any number of signal sources as may be encountered in any of the known transmitting systems such as the last stage of a frequency multiplying chain as may be employed in a television video or audio transmitter.

The tank circuit 7 is shown to be associated with the anode 4 of the power amplifier electron discharge device and to comprise an extension of shell 12 and the inductive tuning element consisting of a predetermined number of bar elements such as is equivalently illustrated at 21. These inductive elements 21 are shown to be directly associated with anode 4 and with the reference point 12 from an R. F. viewpoint thereby physically connecting these inductive tuning elements 21 across the interelectrode capacity present within the electron discharge device.

Therefore, the tank circuit of this invention consists of a predetermined arrangement of inductive elements 21 such as conductive bars whose lengths may be calculated by use of an approximation formula for the characteristic impedance of a transmission line above a ground plane wherein $$Z_0 \cong 138 \log_{10} \frac{4h}{d}$$

where *h* is the height of the bar or inductive element above the ground plane and *d* is the thickness of the bar. The capacitance with which each bar must resonate is given by $$\frac{1}{n} \times C_T$$

where $C_T$ is equal to the lumped interelectrode capacitance of the electron discharge device incorporated in the tank circuit and *n* is the number of bars to be employed. Thus, by changing the number of bars and/or the thickness of the bars, the given frequency range may be covered with a structural circuit arrangement having a minimum stored energy and a physical size no larger than that required for the highest frequency in the given frequency range. There is also provided in the structure of my resonant circuit a means whereby the resonant frequency may be slightly varied by a vernier control to practically meet the resonant requirements after the appropriate number of bars have been inserted within the physical tank concentric with the electron discharge device.

As an example of the main tuning feature of my invention, assume that it is desired to employ a tank circuit capable of being tuned through the frequency range of 176 to 220 mc. with a fixed tube or circuit capacitance of 38 $\mu\mu$f. At 176 mc. the fixed tube capacity has an impedance of approximately 24 ohms. Also assume inductive elements 21 to consist of bars one half inch in thickness then the characteristic impedance with a two inch spacing above the ground plane is $$Z_0 \cong 138 \log_{10} \frac{8}{0.5} \cong 165 \text{ ohms}$$

If the structural arrangement of the tank circuit is such that the bars are six inches long they will be 32° long electrically at 176 mc. which will produce an inductive impedance of $Z_1 = 165 \tan 32° = 103$ ohms. Therefore, to tune the frequency of 176 mc. it would be necessary to employ $$\frac{103}{24} = 4.3 \text{ or } 4 \text{ bars}$$

It may further be shown that at 220 mc. the interelectrode capacity is equal to 19.2 ohms and that $Z_1 = 165 \tan 40° = 139$ ohms where the six inch long bars are electrically equal to 40° at the frequency in question. With $Z_1$=to 139 ohms it would be necessary to employ $$\frac{139}{19.2} \text{equal } 7.2 \text{ or } 7 \text{ bars}$$

to provide a resonant circuit at this frequency. It will be obvious from these theoretical calculations that fractions of bars should be employed to actually achieve the resonant frequency desired. However, for practical reasons the vernier control discussed herein is employed to achieve the desired resonant frequency in a practical manner.

From the above calculations the tank circuit must have a physical size sufficient to provide the desired resonance at the high frequency of the tuning range desired wherein it is possible to provide a change in the $Z_0$ for frequencies lower than this frequency by merely employing a different number of inductive bars, or a different thickness thereof to bring about this desired change, or a combination of both above-mentioned physical changes. To go still lower in frequency in the same size unit, small inductive loops could be employed instead of bars. Therefore, an amplifier circuit is provided which is relatively simple in structure and capable of being tuned over a relatively wide tuning range and having a minimum of stored energy at each frequency so that broadband operation of a tank circuit is not impaired.

One requirement necessitated by the structural arrangement of the tank circuit is that one of the inductive elements 21 is fixed in position adjacent to coupling loop 22 to constitute an output means 8. The remaining portions of output means 8 comprises an appropriate matching section (not illustrated) to accomplish the desired transfer of energy from the resonant tank circuit to a useful load such as an antenna.

Figs. 3, 4, 5, and 6 illustrate the structural detail of the power amplifier of my invention for the practical achievement of the equivalent power amplifier circuit of Fig. 1 whereby a broadband of V. H. F. and/or U. H. F. frequencies may be efficiently tuned and amplified over a moderate frequency range.

Figure 3:
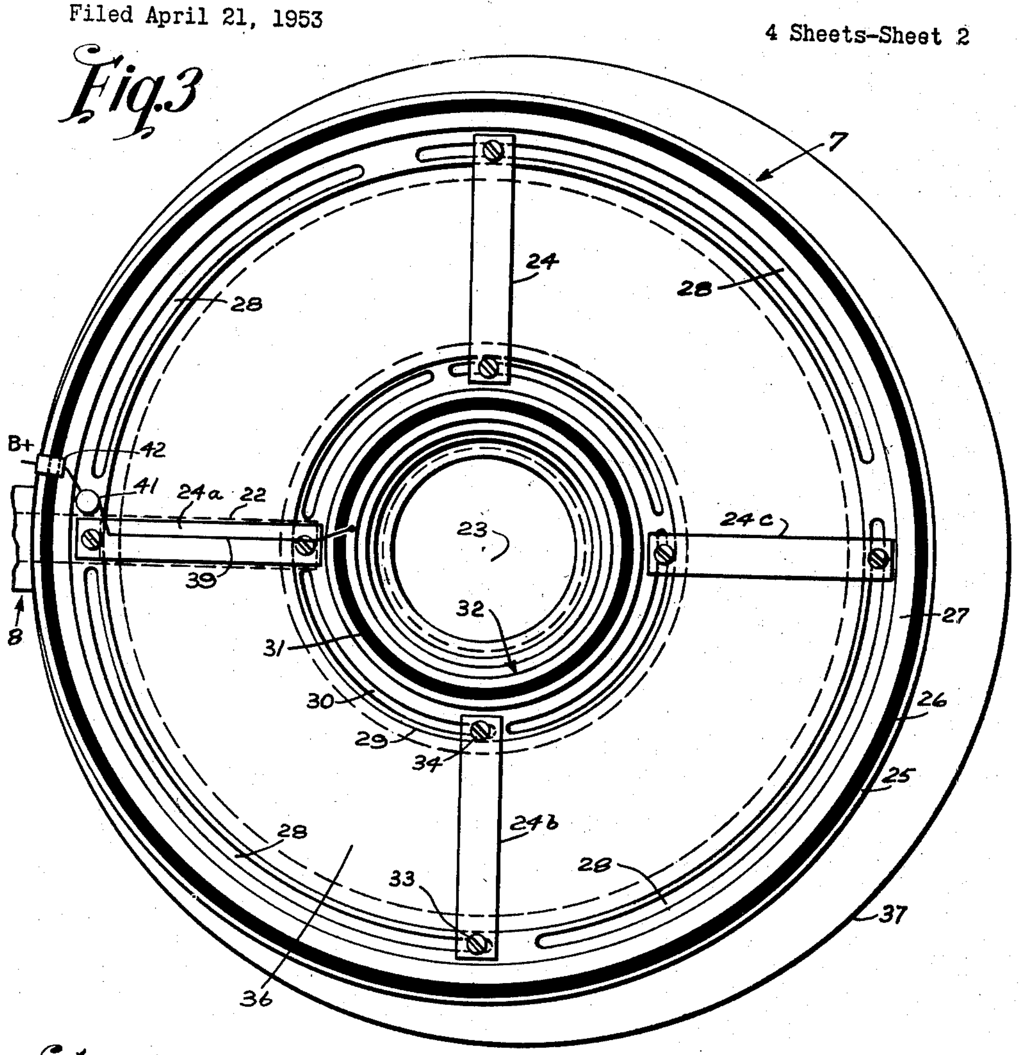
Fig. 3 is a plan view with the top removed illustrating the structural arrangement of an embodiment of my power amplifier.

Referring with greater particularity to Fig. 3, a plan view of the power amplifier with the perforated cover removed is illustrated demonstrating the concentric arrangement of elements wherein the tank circuit 7 is shown to be coaxial of the power type amplifier electron discharge device 23 having associated with the anode radiator means for forced air cooling. As hereinabove described $Z_0$ of the tank circuit of one embodiment comprises a plurality of radially disposed inductive elements or bars 24, **24*a*, 24*b*, 24*c*. This particular number of inductive elements has a predetermined physical size which in conjunction with the internal capacity of device 23, $C_T$, will determine the desired resonant frequency of the tank circuit 7**.

The inductive elements 24, **24*a*, 24*b*, 24*c* are disposed in a radial configuration with respect to device 23 and are supported at one end thereof by the structural cooperation of housing assembly 25, dielectric sleeve filler 26, and the outer anode flanged ring 27 containing therein elongated slots 28 providing means to adjust the tank resonant frequency by appropriately positioning the inductive elements to allow the inclusion of more or less inductive elements, as the case may be, depending upon whether it is desired to have circuit 7 resonant at a higher or lower frequency within the given frequency range limited only by the electrical size of the assembly 25. The other ends of the inductive elements are supported by the structural cooperative arrangement of anode flange assembly 29, containing therein slotted means 30 to cooperate with slots 28 for adjustment in the major frequency changes, dielectric insulating sleeve 31, and the anode contacting ring assembly 32. Once the inductive elements have been predeterminedly located for a desired resonant frequency they are secured in position by means of fasteners 33 and 34** in their respective adjustment slots.

In making the rough frequency adjustment by changing the number of inductive elements, the position, and/or physical size thereof, it is necessary that inductive element **24*a* remains fixed in a coupling relationship with the output loop 22. Further, as is obvious from the calculations given hereinabove for a particular frequency tuning range, it is not practical to employ a fraction of a bar to meet the theoretical requirements of resonance. Therefore, at least one of the inductive elements, such as element 24*c***, is provided with a vernier control, one embodiment of which is illustrated in detail in Fig. 5 whereby the length of this particular inductive element may be varied to achieve the desired resonant condition.

Figure 4:
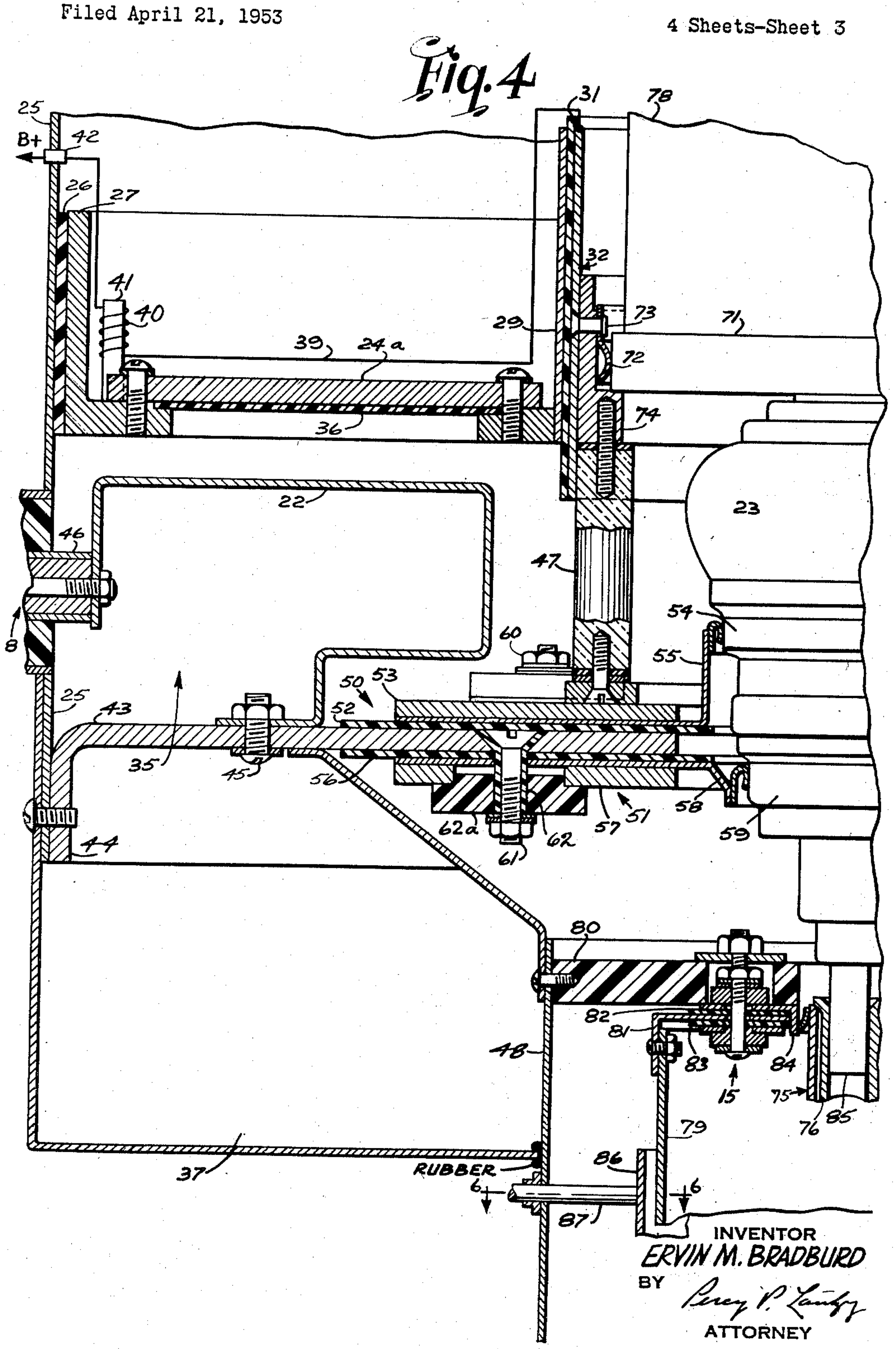
Fig. 4 is a fragmentary cross-section of the tank output circuit and a portion of the input section illustrating the structural relationship therebetween.

To enhance the forced air cooling of device 23, the inductive element cavity 35 is completely covered by a diaphragm 36 of dielectric material secured under the extremities of inductive elements 24, **24*a*, 24*b*, 24*c* which effectively pressurizes cavity 35 in a manner whereby the injected air will be forced to flow through the radiator of device 23 and allow a certain portion of this air to flow downwardly past the screen grid 3 and control grid 2 contacts shown in detail in Fig. 4. The non-concentric assembly shown in Fig. 3 is the outline of air intake chamber 37 which in cooperation with housing assembly 25 and diaphragm 36 forces the air to flow through the radiator of device 23 and out of housing 25 through a perforated cover (not shown) enclosing the top of the housing assembly 25 which electrically provides a shield for the tank circuit 7 and the electron discharge device 23** from stray electrical energy.

Figure 5:
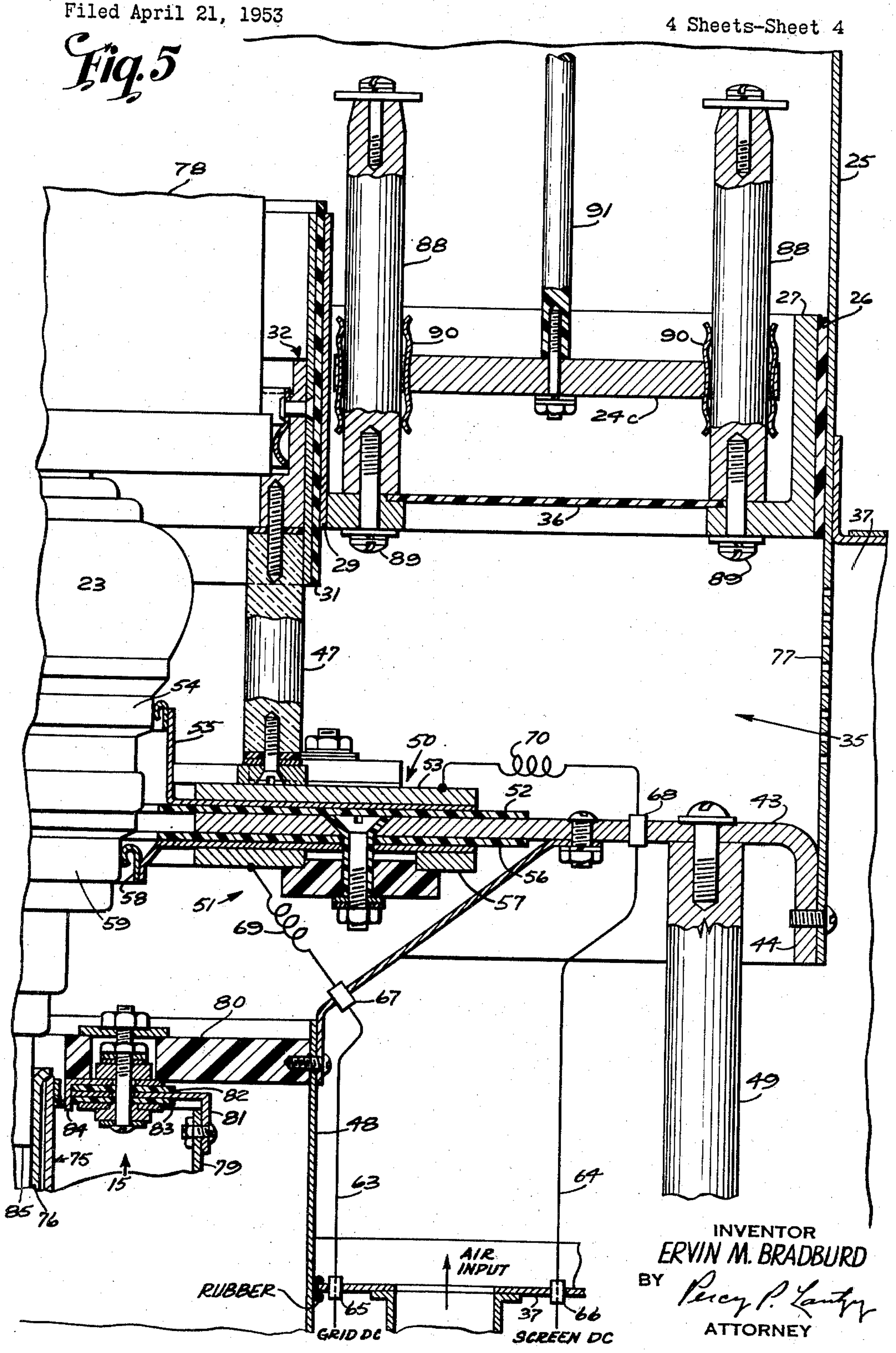
Fig. 5 is a fragmentary cross-section of the tank circuit illustrating an embodiment of a fraquency tuning vernier.

Housing assembly 25, Figs. 4 and 5, is maintained at an electrical reference potential, preferably ground potential, and as a result the structural arrangement of housing 25, dielectric sleeve 26 and flange assembly 27 constitutes a by-pass capacitor to the reference potential for the R. F. signal and for the structural arrangement of the equivalent capacitors 38 illustrated in Fig. 1. Further, assembly 29, insulating sleeve 31 and contact ring assembly 32 provides an R. F. by-pass and at the same time establishes an isolated point, from an R. F. viewpoint, for coupling the desired anode potential to the anode ring of device 23. Where sleeve 31 is employed for this purpose sleeve 26 may be omitted with the flange assembly 27 in direct contact with housing 25. This D. C. connection is made at a convenient point on the periphery of assembly 32 by conductor 39, Fig. 4, which includes in its path a parasitic suppressor 40 in the form of a coil supported on standoff 41 and a feedthrough capacitor 42 which provides a means for isolating the D. C. potential source from the R. F. signal and further allows the coupling of the desired D. C. potential through the wall of assembly 25. Thus, this structural arrangement of my power amplifier provides effective isolation of D. C. anode potential from the anode R. F. power and likewise by means of the structure formed by-pass capacitance places the extremities of the inductive elements furthest from device 23 at the reference point as established by housing 25.

Figs. 4 and 5 illustrate in greater detail certain of the structural components described in connection with Figs. 1 and 3 and as such is self explanatory in certain instances. However, certain of the structure and electrical relationships will be discussed by way of illustrating more clearly certain of the structure aspects of my power amplifier wherein the structural arrangement plays an important part in achieving the desirable efficient tuning at relatively high frequencies having a broadband over a moderate range of tuning frequencies. For instance, housing assembly 25 is illustrated to extend above the anode of device 23 to a perforated cover enclosing the end of the cylindrical structure and has the electrical properties of providing an effective shield for the device 23 and the associated cavity 35 from stray radio frequency energy as well as establishing a path and outlet for the flow of forced air. Housing assembly 25 further extends downward for mechanical association with reference plate assembly 43 which structurally provides the main transverse support for the various elements of this amplifier and electrically establishes the R. F. reference potential for various elements associated with device 23.

Reference plate 43 is a flanged disc having a coaxial aperture therein to allow passage of device 23 therethrough, thereby controlling the concentric relationship therewith and secured by its flanges to housing assembly 25. Output look 22 is secured by fastener 45 to plate 43 for structural support of one end thereof and to establish said point at the reference potential while the other end of loop 22 is secured to the inner conductor or active element 46 of a portion of output means 8. Such an arrangement provides an efficient means for the removal of amplified R. F. power from cavity 35 for coupling to an appropriate matching arrangement dependent upon the frequency being employed in the signal for amplification. Plate 43 further provides means to support anode contacting ring assembly 32 which in turn is brazed or otherwise secured to insulator 31 and anode assembly 29, said means including a plurality of insulated posts or standoffs 47 disposed in spaced relation about device 43 substantially as shown. The outer shell 48 of the input matching section is secured mechanically and electrically to plate 43 for structural support thereof and maintenance of the R. F. reference potential on the outer conductor of the input matching section. Reference plate 43 further provides a support and structural spacer for air chamber 37 by means of standoff 49 appropriately spaced about plate 43.

Reference plate assembly 43 further includes an important electrical function as implied hereinabove. In association therewith structural means are provided which isolate the necessary D. C. potential for various elements of device 23 from the associated R. F. potential and likewise places the control grid 2 and screen grid 3 at the radio frequency reference potential through means of a structural arrangement whereby equivalent by-pass condensers 50 and 51 of Fig. 1 are obtained. By-pass condensers 50 are structurally formed by annular disc 52 of dielectric material sandwiched between annular contacting disc 53 and reference plate 43 wherein actual electrical and physical contact is provided between disc 53 and screen grid contact ring 54 by annular contacting ring 55 composed of spring material. By-pass condensers 51 are structurally formed in a similar manner on the under side of reference plate 43 by annular disc 56 of dielectric material, annular contacting disc 57 and contacting assembly 58 composed of spring metal to provide electrical and physical contact with control grid contact ring 59. These by-pass condensers 50 and 51 are secured on the opposite side of assembly 43 by screw fasteners 60 and 61. The screw fasteners are each electrically insulated from the metallic members forming their respective by-pass condensers by enclosing the shank and conical head portion thereof in a thin dielectric sleeve and a centering dielectric washer. With reference to fastener 61, this insulation structure is illustrated and described. A dielectric sleeve 62 is employed to electrically insulate fastener 61 from reference plate 43 and contacting assemblies 38 while a centering dielectric washer **62*a* is employed to electrically insulate fastener 61 from contacting disc 57**.

D. C. potential is fed to the appropriate grid plates by means of conductors 63 and 64 which are brought through the wall of air chamber 37 by means of feedthrough insulators 65 and 66. Conductor 63 is brought through shell 48 by means of feedthrough condenser 67 while conductor 64 is brought through reference plate 43 by means of feedthrough condenser 68, both feedthrough condensers being appropriately disposed to allow the establishment of an electrical connection at a convenient point on annular discs 57 and 53, respectively. Interposed in conductors 63 and 64 between the feedthrough condensers and the actual connection to their respective contacting discs are parasitic suppressors as indicated by coils 69 and 70, respectively.

Other structural details of interest are shown in Figs. 4 and 5. For instance, the electrical connection from anode conductor assembly 32 to anode ring 71 is provided by means of annular spring clip 72 secured to assembly 32 by means of fastener 73. As illustrated, assembly 32 is flanged at 74 in a manner to receive anode contacting ring 71 and to support a small portion of the weight thereof with the major portion of the weight being supported by collet assembly 75 which is provided with a means for quick detachment. Such a means incorporates a stud-bolt arrangement extending downwardly from the filament lugs of device 23 which when rotated quickly releases the collet 75 and thereby allows quick removal of device 23. Further, assembly 25 is provided with a perforated section 77 which allows air to flow into cavity 35 within the confines of the diaphragm 36 and eventually through radiator 78 of device 23 for appropriate cooling of the anode thereof with a small amount of air leaking past conductors 55 and 58 to establish a small amount of cooling about the screen and control grid contact rings 54 and 59, respectively.

Turning now to the input matching section comprising an outer cylindrical shell 48 in intimate association with reference plate assembly 43 and an inner conducting shell 79 in direct contact with the center conductor 17 of input coaxial line 13 of Fig. 1. Therefore, shell 79, equivalent to shell 10 of Fig. 1, is "hot" with respect to the input R. F. signal, said signal to be matched to the internal impedance between cathode 1 and control grid 2 as hereinabove described in connection with Figs. 1 and 2 by cooperation of electrical lengths of outer shell 48 and inner shell 79 and the spacing therebetween. Likewise, since the power amplifier has an R. F. grounded grid 2 and the R. F. signal is applied to cathode 1 a structural arrangement has been provided for simultaneous application of the necessary D. C. potential to cathode 1 without interaction between the R. F. signal and the D. C. voltage. As disclosed in connection with Fig. 1, the arrangement of bypass condensers 15 and 20 are responsible for the freedom from interaction between the two types of electrical energy.

Condensers 15 are structurally formed as indicated in Figs. 4 and 5 wherein insulating disc 80 provides support for the inner shell 79 and likewise appropriately positions the condenser 15 with respect to the external cathode connections. Shell 79 is provided with an annular flanged portion 81 extending inwardly therefrom. Portion 81 is sandwiched between insulating washers 82 and 83, said portion 81 thereby forming one plate of condenser 15 and spring clip 84 forming the other plate of condenser 15 with washer 82 providing the necessary dielectric material between the condenser plates. This structurally formed condenser 15 provides a means for coupling the R. F. signal therethrough for contact with collet assembly 75. This R. F. signal is then applied to the cathode through tube lugs 85 simultaneously with the D. C. potential applied internally of collet assembly 75. As herein above described, condenser 20, structurally formed in substantially the same manner as condenser 15, provides a further portion of the isolation system for effective bypassing of the R. F. signal but is in association with outer shell 48 rather than conducting shell 79. Such an arrangement of structurally formed by-pass condensers isolates the D. C. voltage supply from the R. F. signal input to cathode 1 and likewise prevents the D. C. voltage from interfering with the R. F. signal applied between cathode 1 and grounded grid 2.

Figure 6:
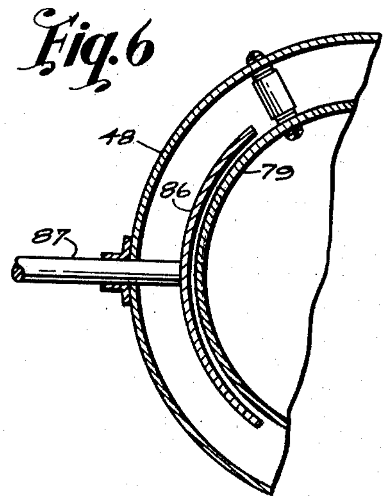
Fig. 6 is a fragmentary of the cross-section of the input portion of my power amplifier illustrating the input matching vernier control taken along line 6—6 of Fig. 4.

The variable condenser 19 of Fig. 1 employed to provide a vernier control of the input impedance match is illustrated in Figs. 4 and 6 to comprise metallic plate 86 in the form of an arc substantially concentric with conducting shell 79 which by means of positioning shaft 87 projecting through the outer shell 48 allows the adjustment of the electrical spacing between plate 86, an electrical extension of outer shell 48, and shell 79. The adjustment of this capacitance in the input matching section will allow a vernier control of impedance matching once the stub tuner 14 has been adjusted and position of inner conductor 17 is located on shell 10, or its equivalent shell 79, to approximate the desired impedance match.

As hereinabove mentioned the tank circuit resonance must be provided with a vernier control, an embodiment of which is illustrated in association with inductive element 24*c*. Fig. 5 illustrates the structural arrangement of such frequency vernier control wherein cylindrical metallic slides 88 are provided, one secured to anode ring flange assembly 27 and the other secured to flange assembly 29 by means of fasteners 89. About the slides 88 are slidably disposed spring clamps 90 which are attached to inductive element 24*c* thereby allowing a vertical movement of element 24*c*. However, clamps 90 maintain the proper amount of tension on slides 88 to maintain element 24*c* in a selected vertical position. Centrally disposed between the extremities of element 24*c* is dielectric rod 91 providing a means to change the position of this inductive element without actual contact therewith to achieve the desired vernier control. The employment of such a vernier control provides a means to correct for the fraction of bar elements called for when theoretically calculated in a practical manner once the appropriate number and size of inductive elements have been positioned to approximate as closely as possible the frequency at which it is desired to have the tank circuit resonant for efficient power amplification of the R. F. signal. This vernier control effectively increases the electrical length of its associated inductive element and changes the height of this element above the assembly 43. This combined action of increased electrical length and increased distance from the ground plane functions to change slightly the amount of interelectrode capacity associated with each of the inductive elements and thereby constitutes a fine adjustment for the resonant frequency of the resonant circuit.

Figure 7:
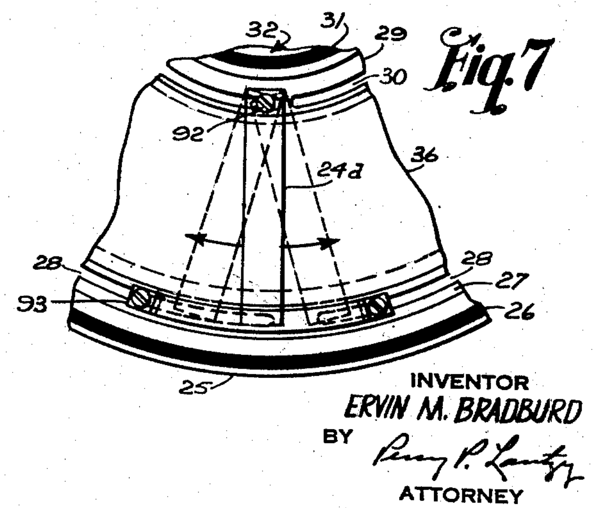
Fig. 7 is a fragmentary plan view with the top removed of my power amplifier illustrating a second embodiment of a resonant frequency control for vernier tuning of the tank circuit.

Fig. 7 is a fragmentary plan view, with the cover removed, illustrating another embodiment of my frequency vernier control whereby inductive element 24*d* is pivoted on screw fastener 92 disposed in slot 30 and held in contact with flange 27 at the other end thereof in guide 93 to provide means to adjust the angular position of element 24*d*. Guide 93 provides a means on anode ring flange 27 to slidably retain element 24*d* within cavity 35. Such an arrangement will allow vernier control of the resonant frequency by altering the positioning of inductive element 24*d* thereby causing an unequal distribution of the amount of interelectrode capacity for resonance with each of the inductive elements included in tank circuit 7.

While I have described above the principles of my invention in connection with specific apparatus, it is to be clearly understood that this description is made only by way of example and not as a limitation to the scope of my invention as set forth in the objects thereof and in the accompanying claims. For example, the features of this invention are applicable to amplifiers generally and are in no way limited to amplifiers of the power type.

I claim:

1. A high frequency amplifier comprising an electron discharge device having a cathode, an anode, a control grid and a screen grid, a cylindrical housing concentric with said device, a metallic plate disposed transversely of said housing and having an axial aperture therein providing clearance about said device, a lumped inductive element assembly radially disposed between said anode and said housing in predetermined resonance with the interelectrode capacity between the anode and the control grid, the anode and the screen grid, and the screen grid and the control grid of said device, insulated supporting means disposed between said plate and said inductive element assembly to cooperate in supporting and establishing a given spacing of said assembly from said plate, radio frequency input means associated with said plate and said cathode, radio frequency output means in a coupling relationship with said assembly, means to apply D. C. voltage to the electrodes of said device, structural means to reference certain of said electrodes to a radio frequency reference point and to isolate said D. C. electrode voltage from said radio frequency energy.

2. A high frequency amplifier according to claim 1, wherein said inductive element assembly comprises a plurality of bar elements radially disposed in a predetermined spaced relationship between said housing and said anode whereby the number of elements present in said assembly determines approximately the resonant frequency of said amplifier.

3. A high frequency amplifier according to claim 2, wherein at least one of said bar elements includes a means to provide a vernier control of the resonant frequency of said amplifier.

4. A high frequency amplifier according to claim 2, wherein said output means includes an inductive loop permanently associated in a coupling relation with at least one of said bar elements to remove amplified radio frequency energy from said inductive element assembly.

5. A high frequency amplifier according to claim 2, wherein said structural means to reference includes an arrangement of a first annular disc of dielectric material sandwiched between said metallic plate and a first annular ring and an arrangement of a second annular disc of dielectric material sandwiched on the other side of said metallic plate between a second annular ring in a manner to place said control grid and said screen grid respectively at said radio frequency reference point.

6. A high frequency amplifier according to claim 5, wherein said D. C. electrode potential is coupled to respective ones of said grids by electrical connection to said first and second annular rings.

7. A high frequency amplifier according to claim 2, wherein said structural means further includes a first dielectric cylinder sandwiched between said housing and the outer circumference of said inductive assembly to reference said bar elements at said radio frequency reference point and a second dielectric cylinder sandwiched between the anode contact assembly and the inner circumference of said inductive element assembly to provide isolation of said radio frequency energy from said D. C. potential applied to said anode contact assembly.

8. A radio frequency amplifier comprising an electron discharge device having at least a cathode, an anode and a control grid, a radio frequency reference potential, a periodic reactive means coupling said reference potential to said control grid, an input means to couple radio frequency signals to said cathode and an output resonant circuit comprising the interelectrode capacity between said control grid and said anode and at least one metallic bar disposed only between said anode and said reference potential, said bar constituting the inductive element of said resonant circuit.

9. A high frequency amplifier comprising an electron discharge device having at least a cathode, an anode and a control grid, a radio frequency reference potential, an input means to couple radio frequency energy between said cathode and said control grid, means coupling said control grid to said reference potential, a resonant circuit including the interelectrode capacity between said anode and said control grid and at least one lumped inductive element disposed between said anode and said radio frequency reference potential, means associated with said inductive element for adjustment of the broadband tuning thereof over a given range of frequencies, and an output means coupling amplified energy from said resonant circuit, said reference potential including a metallic housing coaxial of said discharge device and a metallic plate disposed contiguous to and transverse of said housing in radio frequency coupling relation to said control grid, said input means including a double stub impedance matching device having an inner and outer conductor construction, a first cylindrical member connected at a predetermined point along its length to the inner conductor of said matching device, said first member being in a radio frequency coupling relationship with said cathode, a second cylindrical member contiguous with said metallic plate disposed coaxially with and in spaced relation with said first member, said second member being coupled along its length to the outer conductor of said matching device, said members having a predetermined electrical length to cooperate in matching the impedance of said impedance matching device to the internal impedance existing between said cathode and said control grid, and a capacitive means is coupled relation with said first and second members to provide a vernier control of the impedance match.

10. A high frequency amplifier comprising an electron discharge device having at least a cathode, an anode and a control grid, a radio frequency reference potential, an input means to couple radio frequency energy between said cathode and said control grid, means coupling said reference potential to said control grid and a resonant circuit comprising the interelectrode capacity between said anode and said grid and a plurality of bar elements disposed between said anode and said radio frequency reference potential, said bar elements constituting the inductive reactance of said resonant circuit, the number of said bar elements in conjunction with said interelectrode capacity establishing the resonant frequency thereof, means in coupled relation with said bar elements for adjustment of the broadband tuning thereof over a given range of frequencies, and an output means coupling amplified energy from said resonant circuit, said bar elements being supported at one extremity thereof by an inner flanged assembly coupled to said anode and at the other extremity by an outer flanged assembly coupled to said reference potential.

11. A high frequency amplifier according to claim 10, wherein said means for adjusting the broadband tuning includes longitudinal slots in both said flanged assemblies to allow positioning of the appropriate number of said bar elements to establish the approximate resonance of said resonant circuit and a tuning means associated with at least one of said bar elements for vernier control of the desired resonant frequency.

12. In a broadband frequency amplifier, a metallic housing, a radio frequency reference assembly contiguous to and transverse of said housing, an electron discharge device having at least a cathode, an anode and a control grid, said device being disposed coaxially of said housing and radio frequency coupled to said assembly, a plurality of bar elements disposed radially between said anode and said housing spaced from said assembly to form a resonant circuit in conjunction with the anode-control grid interelectrode capacity of said device, and means to adjust the resonant frequency of said resonant circuit comprising a given number of said bar elements, said bar elements being of a given physical size for resonance with a predetermined portion of said interelectrode capacity for an approximate adjustment of the desired resonant frequency and a vernier control associated with at least one of said bar elements to provide a fine adjustment of the desired resonant frequency.

13. In an amplifier according to claim 12, wherein said vernier control includes a means to lengthen said bar associated therewith.

14. In an amplifier according to claim 12, wherein said vernier control includes means to adjust the angular position of said bar element associated therewith thereby altering the division of said interelectrode capacity resonating with said elements.

15. A radio frequency amplifier comprising an electron discharge device having at least a cathode, an anode, a screen grid and a control grid, a radio frequency reference potential, an input means to couple radio frequency signals to said cathode, an output resonant circuit comprising the inter-electrode capacity between said control grid, said screen grid and said anode and at least one lumped reactive element disposed between said anode and said radio frequency reference potential and a non-resonant impedance coupling said reference potential to each of said grids.

16. An amplifier according to claim 15, wherein said resonant circuit comprises a plurality of lumped reactive elements disposed between said anode and said radio frequency reference potential, the number of said reactive elements in conjunction with said inter-electrode capacity establishing the resonant frequency thereof.

17. An amplifier according to claim 15, further including an inductive loop arrangement in coupling relation with said reactive element for extracting amplified radio frequency energy from said resonant circuit.

18. A radio frequency amplifier comprising an electron discharge device having at least a cathode, an anode, a screen grid and a control grid, a radio frequency reference potential, an input means to couple radio frequency signals to said cathode and a resonant circuit comprising the interelectrode capacity between said control grid, said screen grid and said anode and a plurality of lumped reactive elements disposed between said anode and said reference potential, the number of said reactive elements in conjunction with said inter-electrode capacity establishing the resonant frequency thereof, said reference potential being in coupled relation to said grids, said resonant circuit including a housing constituting a portion of said radio frequency reference potential disposed coaxially of said device, said reactive elements being disposed in a coupled association with said housing and said anode, and a metallic plate disposed transversely of said housing having an axial aperture therein to receive said device for extension therethrough, said plate constituting a further portion of said radio frequency reference potential in a coupling relationship with the screen grid and the control grid of said device.

19. A high frequency amplifier comprising an electron discharge device having at least a cathode, an anode, a screen grid and a control grid, a radio frequency reference potential, an input means to couple radio frequency energy between said cathode and said control grid, an output resonant circuit comprising the inter-electrode capacity between said anode, said control grid and said screen grid and at least one lumped inductive element disposed between said anode and said radio frequency reference potential, a non-resonant impedance coupling said reference potential to said grids, means associateed with said inductive element for adjustment of the broad-band tuning thereof over a given range of frequencies and an output means coupling amplified energy from said resonant circuit.

20. A high frequency amplifier according to claim 19, wherein said resonant circuit comprises a plurality of lumped inductive elements disposed between said anode and said radio frequency reference potential, the number of said inductive elements in conjunction with said interelectrode capacity establishing the resonant frequency thereof.

21. A high frequency amplifier according to claim 20, wherein said inductive elements are supported at one extremity by an inner flanged assembly coupled to said anode and at the other extremity by an outer flanged assembly coupled to said reference potential.

22. A high frequency amplifier according to claim 19, wherein said radio frequency reference potential includes a metallic housing disposed coaxially of said discharge device and a metallic plate disposed contiguous to and transverse of said housing in radio frequency coupling relation to said grids and said input means includes a double stub impedance matching device having an inner and outer conductor construction, a first cylindrical member connected at a predetermined point along its length to the inner conductor of said matching device, said first member being in a radio frequency coupling relationship with said cathode, a second cylindrical member contiguous with said metallic plate disposed coaxially with and in spaced relation from said first member, said second member being coupled along its length to the outer conductor of said matching device, said members having a predetermined electrical length to cooperate in matching the impedance of said impedance matching device to the internal impedance existing between said cathode and said control grid, and a capacitive means in coupled relation with said first and second members to provide a vernier control of the impedance match.

23. A high frequency amplifier comprising an electron discharge device having at least a cathode, an anode, a screen grid and a control grid, a radio frequency reference potential, an input means to couple radio frequency energy between said cathode and said control grid, an output resonant circuit comprising the inter-electrode capacity between said anode, said control grid and said screen grid and a plurality of lumped reactive elements disposed between said anode and said reference potential, the number of said reactive elements in conjunction with said inter-electrode capacity establishing the resonant frequency thereof, said reference potential being in coupled relation with said grids, means associated with said inductive element for adjustment of the broadband tuning thereof over a given range of frequencies, and an output means coupling amplified energy from said resonant circuit, said resonant circuit, including a housing disposed coaxially of said device, said inductive elements being disposed in coupled association with said housing and said anode, and a metallic plate transverse of said housing and in a coupling relation with the screen grid and the control grid of said device whereby said housing and said metallic plate constitute said radio frequency reference potential.

24. A high frequency amplifier comprising an electron discharge device having at least a cathode, an anode, a screen grid and a control grid, a radio frequency reference potential, an input means to couple radio frequency energy between said cathode and said control grid, an output resonant circuit comprising the inter-electrode capacity between said anode, said control grid and said screen grid and a plurality of lumped reactive elements disposed between said anode and said reference potential, the number of said reactive elements in conjunction with said inter-electrode capacity establishing the resonant frequency thereof, said reference potential being in coupled relation with said grids, means associated with said inductive element for adjustment of the broadband tuning thereof over a given range of frequencies, and output means coupling amplified energy from said resonant circuit, said inductive elements being supported at one extremity by an inner flange assembly coupled to said anode and at the other extremity by an outer flanged assembly coupled to said reference potential, said means for adjusting the broadband tuning including longitudinal slots in both said flanged assemblies to allow positioning of the appropriate number of said inductive elements to establish the approximate resonance of said resonant circuit, and a tuning means associated with at least one of said inductive elements for vernier control of the desired resonant frequency.

25. In a broadband frequency amplifier, a metallic housing, a radio frequency reference assembly contiguous to and transverse of said housing, an electron discharge device having at least a cathode, an anode, a screen grid and a control grid, said device being disposed coaxially of said housing and radio frequency coupled to said assembly and at least one lumped inductive element disposed radially between said anode and said housing in parallel spaced relation from said assembly to form a resonant circuit in conjunction with the inter-electrode capacity between the anode, screen grid and control grid of said device.

26. In a broadband frequency amplifier, a metallic housing, a radio frequency reference assembly contiguous to and transverse of said housing, an electron discharge device having at least a cathode, an anode and a control grid, said device being disposed coaxially of said housing and radio frequency coupled to said assembly, and a plurality of inductive elements disposed radially between said anode and said housing spaced from said assembly to form a resonant circuit in conjunction with the inter-electrode capacity between the anode and control grid of said device, and means to adjust the resonant frequency of said resonant circuit comprising the number of said elements, said elements being of a given physical size for resonance with a predetermined portion of said inter-electrode capacity for an approximate adjustment of the desired resonant frequency, and a vernier control associated with at least one of said elements to provide a fine adjustment of the desired resonant frequency.

27. In an amplifier according to claim 26, wherein said vernier control includes a means to lengthen said element associated therewith.

28. In an amplifier according to claim 26, wherein said vernier control includes means to adjust the angular position of said element associated therewith, thereby altering the division of said inter-electrode capacity resonating with said elements.

References Cited in the file of this patent

UNITED STATES PATENTS

| | | |
|---|---|---|
| 2,156,261 | Evans | May 2, 1939 |
| 2,463,724 | Starner | Mar. 8, 1949 |
| 2,524,821 | Montgomery | Oct. 10, 1950 |
| 2,551,715 | Young | May 8, 1951 |
| 2,554,500 | Priest | May 29, 1951 |
| 2,579,820 | Haller et al. | Dec. 25, 1951 |
| 2,642,533 | Priest | June 16, 1953 |
| 2,706,802 | Meisenheimer | Apr. 19, 1955 |
| 2,714,135 | Leyton | July 26, 1955 |
| 2,756,338 | Smith | July 24, 1956 |

FOREIGN PATENTS

| | | |
|---|---|---|
| 656,760 | Great Britain | Aug. 29, 1951 |